United States Patent
Raming et al.

(10) Patent No.: US 9,422,634 B2
(45) Date of Patent: Aug. 23, 2016

(54) METHOD AND APPARATUS FOR PRODUCING A SINGLE CRYSTAL

(71) Applicant: Siltronic AG, Munich (DE)

(72) Inventors: Georg Raming, Tann (DE); Ludwig Altmannshofer, Lenggries (DE); Gundars Ratnieks, Burghausen (DE); Johann Landrichinger, Burgkirchen (AT); Josef Lobmeyer, Bad Fuessing (DE); Alfred Holzinger, Handenberg (AT)

(73) Assignee: SILTRONIC AG, Munich (DE)

( * ) Notice: Subject to any disclaimer, the term of this patent is extended or adjusted under 35 U.S.C. 154(b) by 823 days.

(21) Appl. No.: 13/705,207

(22) Filed: Dec. 5, 2012

(65) Prior Publication Data

US 2013/0160698 A1  Jun. 27, 2013

(30) Foreign Application Priority Data

Dec. 21, 2011  (DE) .................. 10 2011 089 429

(51) Int. Cl.
*C30B 13/20* (2006.01)
*C30B 13/30* (2006.01)
*C30B 29/06* (2006.01)

(52) U.S. Cl.
CPC ............... *C30B 13/20* (2013.01); *C30B 13/30* (2013.01); *C30B 29/06* (2013.01); *Y10T 117/1088* (2015.01)

(58) Field of Classification Search
CPC ............... B60W 2420/42; B60W 2520/14; B60W 2520/20; B60W 2550/146; B60W 30/12; B60W 30/18163; B60W 40/10; B62D 15/025; C30B 13/20; C30B 13/30; Y10T 117/1088

See application file for complete search history.

(56) References Cited

U.S. PATENT DOCUMENTS

| 4,876,438 A | * | 10/1989 | Watanabe et al. ............ 219/497 |
| 4,942,279 A | * | 7/1990 | Ikeda ...................... C30B 13/20 117/222 |
| 2010/0107968 A1 | * | 5/2010 | Vaabengaard et al. ......... 117/52 |

(Continued)

FOREIGN PATENT DOCUMENTS

| CN | 1847468 A | * 10/2006 | ............. C30B 13/18 |
| DE | 1217925 B | 6/1966 | |

(Continued)

OTHER PUBLICATIONS

A. Muiznieks et al. "Stress-Induced Dislocation Generation in Large FZ- and CZ-Silicon Single Crystals—Numerical Model and Qualitative Considerations", Journal of Crystal Growth 230 (2001) pp. 305-313.

*Primary Examiner* — Robert M Kunemund
*Assistant Examiner* — Hua Qi
(74) *Attorney, Agent, or Firm* — Brooks Kushman P.C.

(57) ABSTRACT

Single crystals are produced by means of the floating zone method, wherein the single crystal crystallizes below a melt zone at a crystallization boundary, and the emission of crystallization heat is impeded by a reflector surrounding the single crystal, wherein the single crystal is heated in the region of an outer edge of the crystallization boundary by means of a heating device in a first zone, wherein a distance $\Delta$ between an outer triple point $T_a$ at the outer edge of the crystallization boundary and a center Z of the crystallization boundary is influenced. An apparatus for producing the single crystal provides a heat source below the melting induction coil and above the reflector.

12 Claims, 3 Drawing Sheets

(56) References Cited

U.S. PATENT DOCUMENTS

2010/0307406 A1    12/2010  Shindo
2011/0095018 A1*   4/2011   von Ammon et al. ....... 219/632

FOREIGN PATENT DOCUMENTS

| | | | | |
|---|---|---|---|---|
| DE | 1794206 | 7/1971 | | |
| DE | 30 07 377 A1 | 9/1981 | | |
| DE | 3007416 A1 | 9/1981 | | |
| DE | 102004058547 A1 | 6/2006 | | |
| DE | CN 1847468 A | * 10/2006 | ............. | C30B 13/18 |
| EP | 0490071 A1 | 6/1992 | | |
| EP | 2246461 A1 | 11/2010 | | |
| GB | 1249401 | 10/1971 | | |
| JP | S39022104 | 8/1939 | | |
| JP | S48112271 | 12/1973 | | |
| JP | 7157388 A | 6/1995 | | |
| TW | 200942652 A1 | 10/2009 | | |

* cited by examiner

US 9,422,634 B2

METHOD AND APPARATUS FOR PRODUCING A SINGLE CRYSTAL

CROSS-REFERENCE TO RELATED APPLICATIONS

This application claims priority to German Patent Application No. 10 2011 089 429.2 filed Dec. 21, 2011 which is herein incorporated by reference.

BACKGROUND OF THE INVENTION

1. Field of the Invention

The invention relates to a method for producing a single crystal by means of the floating zone method, and to an apparatus suitable for application of the method.

2. Background Art

On an industrial scale, the floating zone method is used, in particular, for producing single crystals composed of silicon. For this purpose, polycrystalline silicon is inductively melted and crystallized on a monocrystalline seed crystal. The polycrystalline silicon is usually provided in the form of a feed rod, which, starting from its lower end, is gradually melted by means of an induction heating coil, wherein a melt zone composed of molten silicon that forms serves for the growth of the single crystal. This method is referred to hereinafter as the FZ method.

One variant of the FZ method, which is referred to as the GFZ method hereinafter, uses polycrystalline granular silicon instead of a feed rod. While the FZ method makes use of one induction heating coil for melting the feed rod and for the controlled crystallization of the single crystal, the GFZ method makes use of two induction heating coils. The polycrystalline granules are melted with the aid of a first induction heating coil on a plate and subsequently flow through a hole in the center of the plate to the growing single crystal and form a melt zone. The crystallization of the single crystal is controlled with the aid of a second induction heating coil, which is arranged below the first induction heating coil. Further details concerning the GFZ method are described, for example, in US 2011/0095018 A1.

DE 30 07 377 A1 describes the FZ method and an apparatus suitable for carrying out the latter, wherein the description is devoted to the problem of preventing the occurrence of thermal stress. In order to solve the problem, it is proposed to reheat the single crystal by thermal radiation of a reflective protective sheath surrounding the single crystal. The publication by A. Muiznieks et al. (Journal of Crystal Growth 230(2001), 305-313) confirms the efficacy of a protective sheath—designated therein as a reflector— for reducing thermal stresses. Simulation calculations also show that the thermal stresses are highest in the center of the crystallization boundary and that their contribution increases with the diameter of the single crystal. Furthermore, it is shown that thermal stress, particularly in the center of the crystallization boundary, increases as the extent to which the crystallization boundary is bent toward the single crystal increases, and that this bending increases with the rate of crystallization of the single crystal.

Therefore, there is a need for measures which are directed against bending of the crystallization boundary, without having to restrict the rate of crystallization, and which are suitable for inhibiting thermal stress and the ensuing risk of the formation of dislocations without loss of productivity.

Since a reflector surrounding the single crystal impedes the heat transfer via the lateral surface of the single crystal, less heat has to be supplied to the melt zone via the induction heating coil in order to ensure a height of the melt zone that is required for crystal growth. This is a further advantage associated with the use of a reflector.

As the diameter of the single crystal increases and the rate of crystallization increases, the bending of the crystallization boundary increases. This aggravates the problems on account of thermal stresses. The use of a reflector then no longer suffices as a countermeasure.

SUMMARY OF THE INVENTION

Therefore, an object of the present invention is to counteract the bending of the crystallization boundary and the loading of the single crystal by thermal stress in a more advantageous way. These and other objects are achieved by means of a method for producing a single crystal by means of the floating zone method, wherein the single crystal crystallizes with the support of an induction heating coil below a melt zone at a crystallization boundary, and the emission of crystallization heat is impeded by a reflector surrounding the single crystal, characterized in that the single crystal is heated in the region of an outer edge of the crystallization boundary by means of a heating device in a first zone, wherein a distance Δ between an outer triple point $T_a$ at the outer edge of the crystallization boundary and a center Z of the crystallization boundary is influenced. These objects are also achieved by means of an apparatus for producing a single crystal by means of the floating zone method, comprising a reflector surrounding the single crystal, and a heating device for heating the single crystal in the region of an outer edge of a crystallization boundary of the single crystal.

DETAILED DESCRIPTION OF THE PREFERRED EMBODIMENT(S)

The present invention pursues the aim of increasing the temperature in the region of the upper end of the single crystal from the side such that the axial position of the crystallization boundary at the circumference of the single crystal is influenced, to be precise influenced in such a way that the bending of the crystallization boundary, that is to say the vertical distance between the center and the edge of the crystallization boundary, is limited.

The present invention can be applied independently of whether silicon or some other semiconductor material is crystallized and independently of whether the crystallization takes place according to the FZ or the GFZ method.

In accordance with one preferred embodiment of the invention, the single crystal is heated by means of a radiant heating system arranged around the upper end of the growing single crystal. The radiant heating system can emit, for example, IR or optical radiation. The use of a halogen radiant heating system is particularly preferred.

As an alternative, instead of a radiant heating system, it is also possible to use an induction heating system or a resistance heating system or some other heating device by which heat can be transferred into the region of the outer edge of the crystallization boundary.

The invention is described in greater detail below with reference to the figures.

Figure 1:
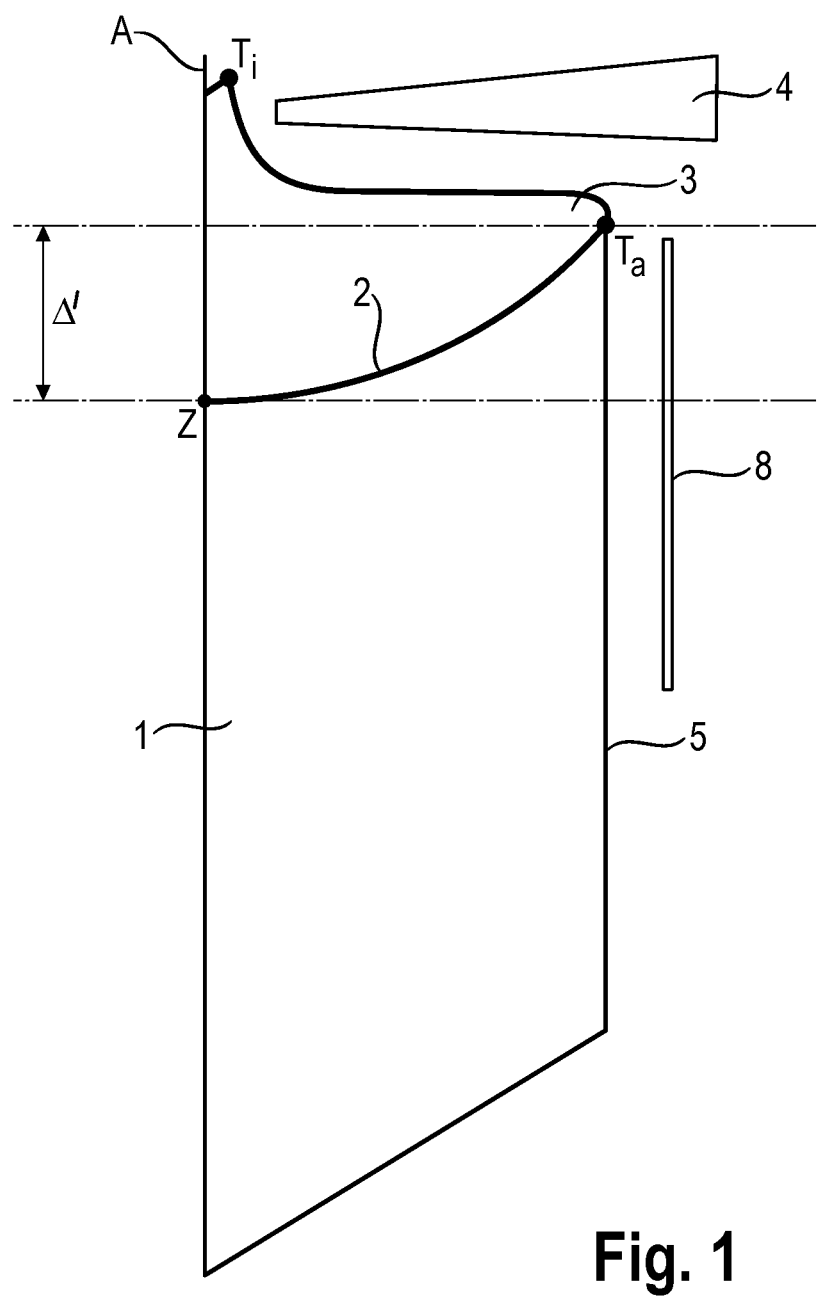
FIG. 1 is a sectional drawing that represents the prior art and shows half of a longitudinal section through a single crystal which was produced in accordance with the floating zone method. Besides the single crystal, the illustration shows an induction heating coil for controlling the crystallization of the single crystal, and a reflector surrounding the single crystal, the reflector reflecting thermal radiation emitted by the single crystal.

The single crystal 1 grows at a crystallization boundary 2 between the single crystal and a melt zone 3 composed of molten material and is lowered in the process (FIG. 1). The molten material preferably originates from a feed rod composed of polycrystalline silicon or from granules composed of polycrystalline silicon. The melt zone 3 is heated with the aid of a radio-frequency induction heating coil (RF inductor) 4. Crystallization heat that arises during the growth of the single crystal is conducted through the single crystal and emitted, in particular, via the lateral surface 5 of the single crystal. The heat transfer has the consequence that, particularly in the region of the crystallization boundary 2, an inhomogeneous temperature field arises, which is responsible for the bending of the crystallization boundary 2 towards the single crystal. The bending of the crystallization boundary is defined as the axial distance Δ between an outer triple point $T_a$ at the outer edge of the crystallization boundary and the center Z of the crystallization boundary 2. The center Z may be visualized by reference to the drawing figures, where only the right side of the cross section of a rotationally symmetrical crystal is shown.

With the aid of a reflector 8 surrounding the single crystal, this reflector reflecting thermal radiation emitted by the single crystal 1, in particular the position of the center Z of the crystallization boundary 2 on the geometrical axis A is influenced.

Figure 2:
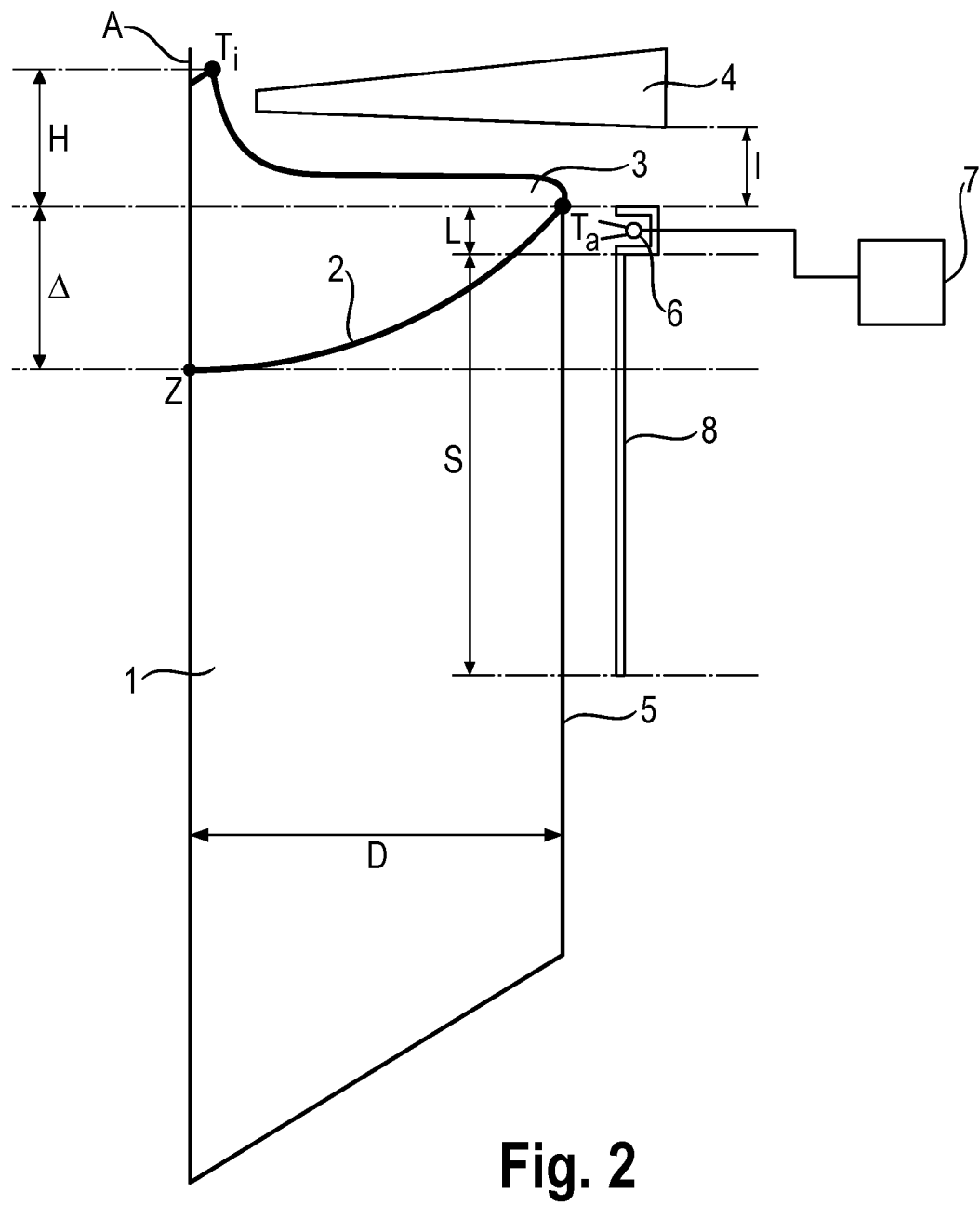
FIG. 2 is a sectional drawing representing the invention.

The present invention furthermore provides for heating the single crystal in the region of an outer edge of the crystallization boundary by means of a heating device 6, and in this way influencing the distance α between the outer triple point $T_a$ at the outer edge of the crystallization boundary and center Z of the crystallization boundary 2 (FIG. 2).

The heating device 6 is arranged in immediate vicinity of the single crystal, and the single crystal is directly heated by the heating device 6.

With the aid of the heating device 6, the single crystal is fed energy having an electrical power of preferably not less than 2 kW and not more than 12 kW, more preferably not less than 4 kW and not more than 10 kW. The upper limit of this range is relative to a single crystal having a diameter of 150 mm. If a single crystal having a larger diameter is intended to be produced, the upper limit of the range is higher by a factor corresponding to the ratio of the diameters.

The single crystal is preferably heated with the aid of the heating device in such a way that the distance α between the outer triple point $T_a$ at the outer edge of the crystallization boundary and the center Z of the crystallization boundary 2 is not more than 90% of the distance α', and more preferably not more than 80%. The distance α' is the distance between the outer triple point $T_a$ and the center Z that exists if the heating device 6 is dispensed with.

It is preferred to control the electrical power of the heating device 6 in a manner dependent on the length of the single crystal. For this purpose, a controller 7 is provided, which influences the electrical power of the heating device, for example a controller that reduces the electrical power of the heating device as the length of the single crystal increases.

It is furthermore preferred to regulate the electrical power of the induction heating coil and, if appropriate, additionally the speed of lowering the single crystal during the method in such a way that a chosen absolute value of the distance H in the melt zone does not change, for example by means of the distance 1 between the outer edge of the crystallization boundary and the radio-frequency induction heating coil being kept as constant as possible. The distance H in the melt zone corresponds to the distance between an inner triple point $T_i$ at the upper end of the melt zone and the outer triple point $T_a$ at the outer edge of the crystallization boundary.

That region of the single crystal which is heated with the aid of the heating device 6 corresponds to a first zone, which has a length L in the longitudinal direction of the single crystal. The length L, which, proceeding from the outer triple point $T_a$, runs parallel to the geometrical axis A (longitudinal axis) of the single crystal, should not be longer than the distance Δ and should preferably not be longer than Δ/2. The distance Δ is the distance between the outer triple point $T_a$ at the outer edge of the crystallization boundary and the center Z of the crystallization boundary which arises when the invention is used. If the heating device 6 also heated a region below the region mentioned, although thermal stresses could thereby be reduced, the bending would increase. Moreover, excessive impeding of dissipation of heat from the single crystal by the heating device 6 would be an obstacle to an economic rate of crystallization. For the same reason, it is preferred to limit the axial length of the reflector 8. The reflector should be dimensioned such that it impedes the emission of crystallization heat in a second zone, such that, in its region of influence, the radial temperature distribution in the single crystal is made more uniform. The second zone is adjacent to the first zone. It has a length S in the longitudinal direction of the single crystal, wherein the sum of the lengths S and L preferably corresponds to 0.5 to 1.5 times the length of the diameter D of the single crystal. The reflectance of the inner wall of the reflector that is directed towards the single crystal is preferably not less than 80%. The reflector 8 preferably consists completely of silver or has at least an inner wall which consists of silver. The inner wall is preferably polished.

The heating device 6 is preferably arranged directly above the reflector 8. However, it can also be integrated into the upper end of the reflector 8. If that is not the case, the heating device 6 and the reflector 8 can be arranged such that they are mechanically connected or separated from one another. As a result of the latter, the heat conduction to the reflector can be effectively restricted. The heating device 6 is produced from high-temperature-resistant material having a high reflectance and is preferably embodied as a radiant heating system. Particular preference is given to a radiant heating system comprising one or a plurality of halogen lamps, in particular a radiant heating system formed by a ring of halogen lamps which surrounds the single crystal in the region of the outer edge of the crystallization boundary.

Figure 3:
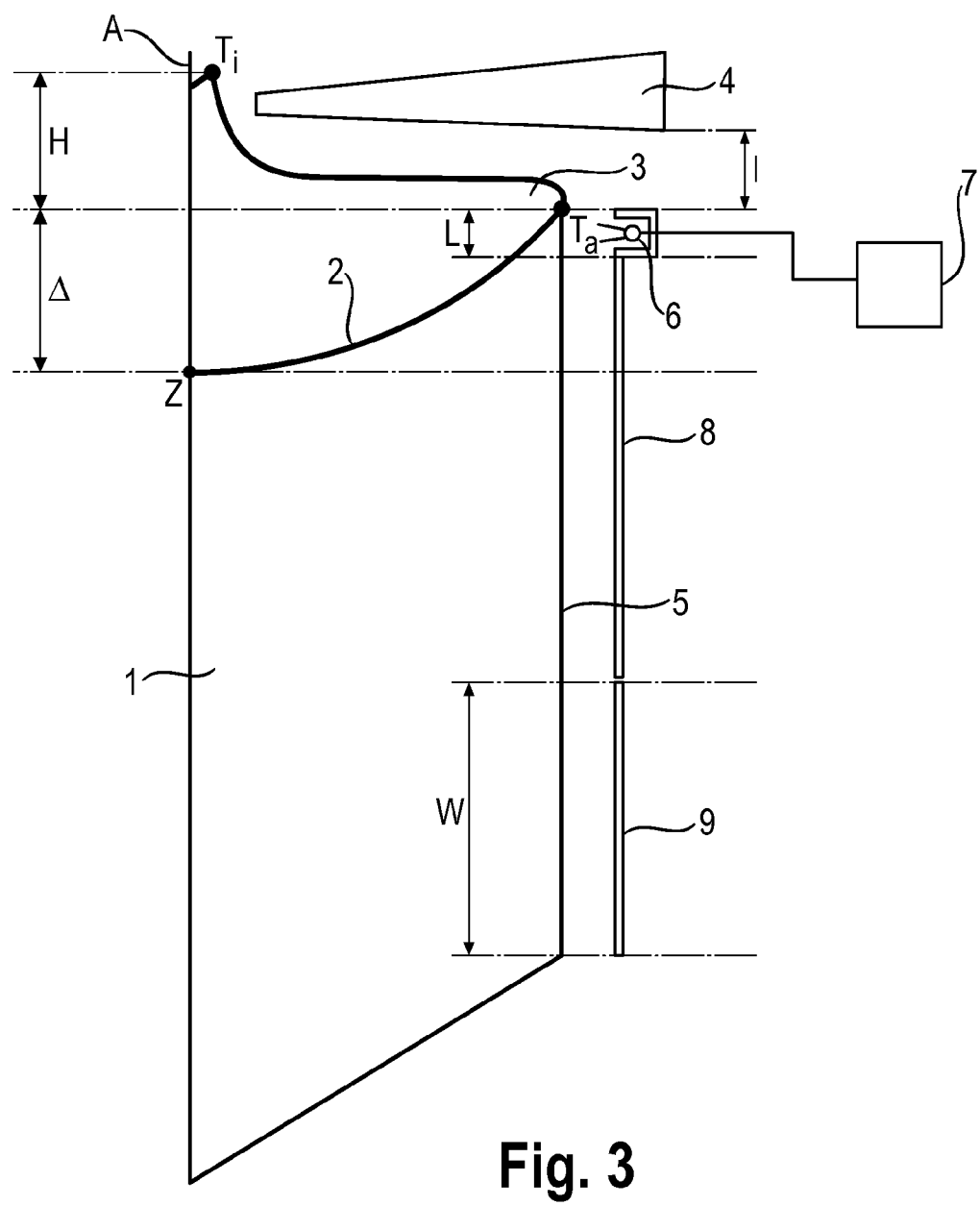
FIG. 3 is a further sectional drawing representing the invention and showing an additional preferred feature.

The apparatus according to the invention as shown in FIG. 3 differs from the apparatus shown in FIG. 2 essentially in an additional feature, namely a body 9 surrounding the single crystal and absorbing thermal radiation. This body can be a passive heat sink or an active cooling device. It facilitates the emission of crystallization heat by the single crystal in a third zone, which follows the second zone. The third zone has the length W and begins at a distance from the outer triple point $T_a$ that has at least the length of the diameter D of the single crystal. The length W of the third zone is preferably not shorter than half of the diameter of the single crystal. The body 9 has a reflectance of preferably not more than 20%. It is connected to the reflector 8 via a thermally insulating bridge or mounted without touching the reflector.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a single crystal having a diameter D by means of a floating zone method, wherein a precursor feed material is melted by an induction heating coil to form a melt zone, the single crystal crystallizes below a melt zone at a crystallization boundary, and the emission of crystallization heat is impeded by a reflector surrounding the single crystal, comprising heating the single crystal in a first zone in a region of an outer edge of the crystallization boundary by means of a heating device, wherein that first zone of the single crystal which is heated by means of the heating device has, in the longitudinal direction of the single crystal from an outer triple point $T_a$ at the outer edge of the crystallization boundary, a length L that is not longer than a distance $\Delta$, the distance $\Delta$ being the axial distance between the outer triple point $T_a$, and a center Z of the crystallization boundary.

2. The method of claim 1, wherein the single crystal is heated with the aid of the heating device such that the distance $\Delta$ between the outer triple point $T_a$ at the outer edge of the crystallization boundary and the center Z of the crystallization boundary is not more than 90% of a distance $\Delta'$ between the outer triple point $T_a$ and the center Z when the heating device is not used.

3. The method of claim 1, wherein the electrical power of the induction heating coil is regulated in such a way that a chosen absolute value of a distance H in the melt zone between an inner triple point $T_i$ at an upper end of the melt zone and the outer triple point $T_a$ at the outer edge of the crystallization boundary does not change.

4. The method of claim 2, wherein the electrical power of the induction heating coil is regulated in such a way that a chosen absolute value of a distance H in the melt zone between an inner triple point $T_i$ at an upper end of the melt zone and the outer triple point $T_a$ at the outer edge of the crystallization boundary does not change.

5. The method of claim 1, wherein the single crystal is heated by means of a radiant heating system as a heating device.

6. The method of claim 1, wherein the single crystal is heated by means of an induction heating system as a heating device.

7. The method of claim 1, wherein the electrical power of the heating device is varied according to the length of the single crystal.

8. The method of claim 1, wherein energy having an electrical power of not less than 2 kW is fed to the single crystal by the heating device.

9. The method of claim 1, wherein the reflector impedes the emission of crystallization heat in a second zone, which is adjacent to and below the first zone and which has a length S in the longitudinal direction of the single crystal, wherein the sum of the lengths S and L corresponds to 0.5 to 1.5 times the diameter D of the single crystal.

10. The method of claim 9, wherein a thermal radiation absorbing body surrounds the single crystal and absorbs thermal radiation facilitating emission of crystallization heat in a third zone which follows the second zone and which begins at a distance from the outer triple point $T_a$ which has at least the length of the diameter D of the single crystal.

11. The method of claim 1, wherein the melt zone is formed by melting of a polycrystalline feed rod composed of silicon.

12. The method of claim 1, wherein the melt zone is formed by melting of polycrystalline granular silicon.

* * * * *